United States Patent
Yamamoto et al.

(10) Patent No.: US 8,558,542 B2
(45) Date of Patent: Oct. 15, 2013

(54) MAGNETIC DETECTOR AND INPUT DEVICE USING THE SAME

(75) Inventors: Tamotsu Yamamoto, Hyogo (JP); Hiroaki Nishiono, Osaka (JP); Noritaka Hayama, Osaka (JP); Hiroto Inoue, Kyoto (JP); Kenji Kataoka, Osaka (JP)

(73) Assignee: Panasonic Corporation, Osaka (JP)

( * ) Notice: Subject to any disclaimer, the term of this patent is extended or adjusted under 35 U.S.C. 154(b) by 467 days.

(21) Appl. No.: 12/718,261

(22) Filed: Mar. 5, 2010

(65) Prior Publication Data

US 2010/0231212 A1   Sep. 16, 2010

(30) Foreign Application Priority Data

Mar. 13, 2009  (JP) .................. 2009-060509

(51) Int. Cl.
*G01R 33/02*   (2006.01)
(52) U.S. Cl.
USPC ...... 324/247; 324/173; 324/174; 324/514.16; 324/263; 73/488; 73/520.01
(58) Field of Classification Search
USPC ........ 324/173–174, 200–263; 73/488–520.01
See application file for complete search history.

(56) References Cited

U.S. PATENT DOCUMENTS

| 5,861,876 | A | 1/1999 | Nakayama |
| 6,144,370 | A | 11/2000 | Eleyan et al. |
| 7,043,061 | B2* | 5/2006 | Hamid et al. ................ 382/124 |
| 7,221,151 | B2* | 5/2007 | Schroeder et al. ....... 324/207.24 |
| 2003/0142071 | A1 | 7/2003 | Yu |
| 2007/0046287 | A1* | 3/2007 | Vervaeke et al. ............. 324/251 |

FOREIGN PATENT DOCUMENTS

| JP | 06-342338 A | 12/1994 |
| JP | 2002140160 A | 5/2002 |
| JP | 2002140160 A * | 5/2002 |
| JP | 2004-5091 A | 1/2004 |

OTHER PUBLICATIONS

Chinese Application Serial No. 201010133925.5, Chinese Office Action mailed Nov. 2, 2011, 5 pgs.

* cited by examiner

*Primary Examiner* — Jermele M Hollington
*Assistant Examiner* — Temilade S Rhodes-Vivour
(74) *Attorney, Agent, or Firm* — RatnerPrestia

(57) ABSTRACT

A magnetic detector includes a detecting section having a surface facing a magnetic body which moves and emits a magnetic flux. The detecting section includes plural magnetic sensors for detecting the magnetic flux. The magnetic sensors are arranged in a matrix form having three or more rows and three or more columns arranged along the surface of the detecting section. The magnetic detector provides an input device precisely detecting a moving direction and a moving amount of the magnetic body.

13 Claims, 14 Drawing Sheets

MAGNETIC DETECTOR AND INPUT DEVICE USING THE SAME

FIELD OF THE INVENTION

The invention relates to a magnetic detector to be used for operating various electronic apparatuses, and to an input device including the detector.

BACKGROUND OF THE INVENTION

As electronic apparatuses, such as a mobile telephone and a personal computer, have had advanced functions and a small size, an input device used in these apparatuses is demanded to operate reliably in various ways.

FIG. 14 is a cross sectional view of conventional input device 501. Actuator 1 having a spherical shape is made of insulating resin. Plural magnets 2 made of ferrite and having substantially a disk shape are embedded in an outer circumference surface of actuator 1. Upper case 3 and lower case 4 are made of a thin metal plate. Operation unit 1 having the spherical shape is accommodated rotatably between upper case 3 and lower case 4. An upper portion part of actuator 1 protrudes from an opening formed in an upper surface of upper case 3. Plural wiring patterns are formed on upper and lower surfaces of a circuit board. Four magnetic sensors 6, such as Hall elements, are mounted on the upper surface of circuit board 5 in front, rear, left and right directions facing actuator 1 with a predetermined gap. Controller 7, such as a microcomputer, is also mounted onto the upper surface of circuit board 5. Four magnetic sensors 6 are connected to controller 7 via the wiring patterns, thus constituting input device 501.

Input device 501 is installed in an operating panel of an electronic apparatus, such as a mobile telephone or a personal computer, while the upper portion of actuator 1 protrudes. Controller 7 is electrically connected to an electronic circuit of the electronic apparatus via a connector and a lead wire.

While plural menus, such as a name and a title of music or a cursor are displayed on a display, such as a liquid crystal display element of the electronic apparatus, when an operator rotates an upper portion of actuator 1 with a finger forward, backward, leftward or rightward, magnets 2 embedded in the outer circumference of actuator 1 moves along the circumference of actuator 1. If actuator 1 rotates leftward, magnet 2A first approaches magnetic sensor 6, and then, magnet 2B approaches magnetic sensor 6.

Magnetic sensor 6 detects magnetic flux of magnets 2 alternately approaching and being removed away, and controller 7 outputs a pulse signal to the electronic circuit of the apparatus. The electronic circuit of the electronic apparatus detects a rotation direction and a rotation angle of actuator 1 based on the pulse signal, and moves the cursor on the displayed menus toward left.

If the operator rotates actuator 1 rightward, forward, backward or in a diagonal direction between them, controller 7 similarly outputs a pulse signal. Namely, the electronic circuit detects a rotation angle and a rotation angle of actuator 1 based on the pulse signal and moves the cursor rightward, upward, downward, or diagonally.

Upon rotating actuator 1 in a desired direction while seeing the display of the electronic apparatus, the operator can move the cursor in the desired direction, selecting menus.

Conventional input device 501, however, detects a rotation angle of actuator 1 just roughly, and causes an error, being prevented from detecting the rotation angle accurately.

SUMMARY OF THE INVENTION

A magnetic detector includes a detecting section having a surface facing a magnetic body which moves and emits a magnetic flux. The detecting section includes plural magnetic sensors for detecting the magnetic flux. The magnetic sensors are arranged in a matrix form having three or more rows and three or more columns arranged along the surface of the detecting section.

The magnetic detector provides an input device precisely detecting a moving direction and a moving amount of the magnetic body.

BRIEF DESCRIPTION OF PREFERRED EMBODIMENTS

Exemplary Embodiment 1

Figure 1:
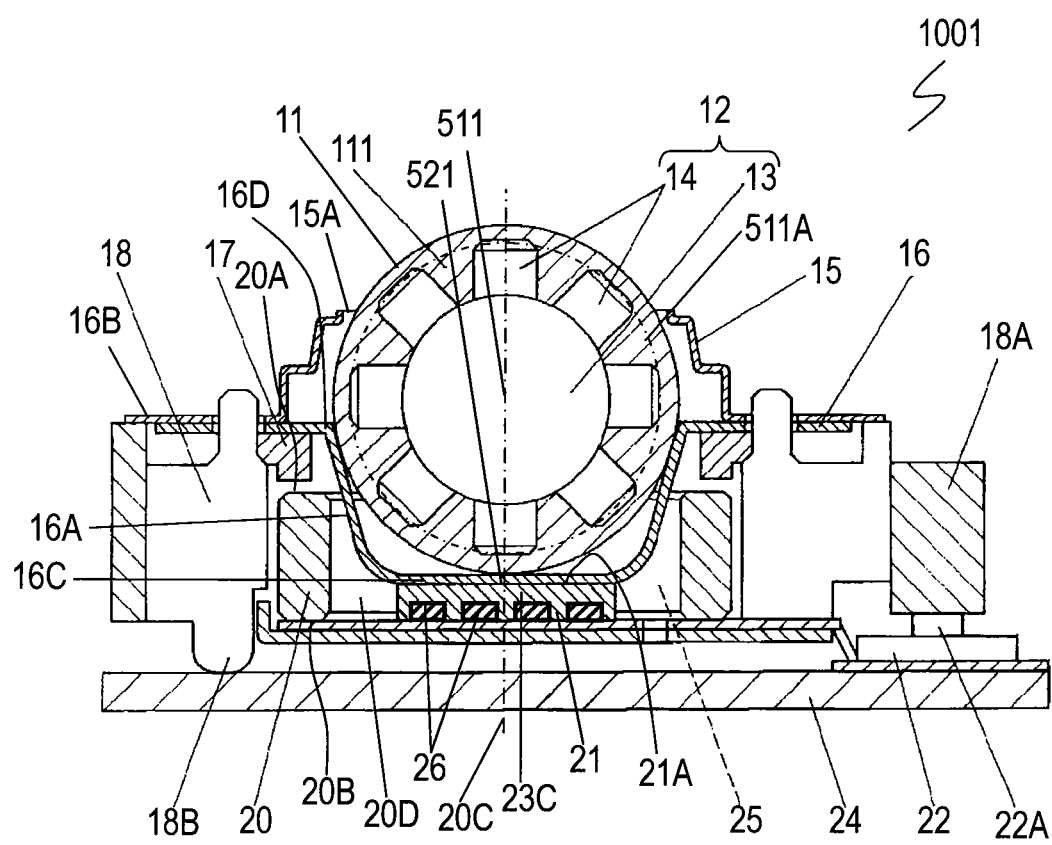
FIG. 1 is a cross sectional view of an input device according to Exemplary Embodiment 1 of the present invention.
Figure 2:
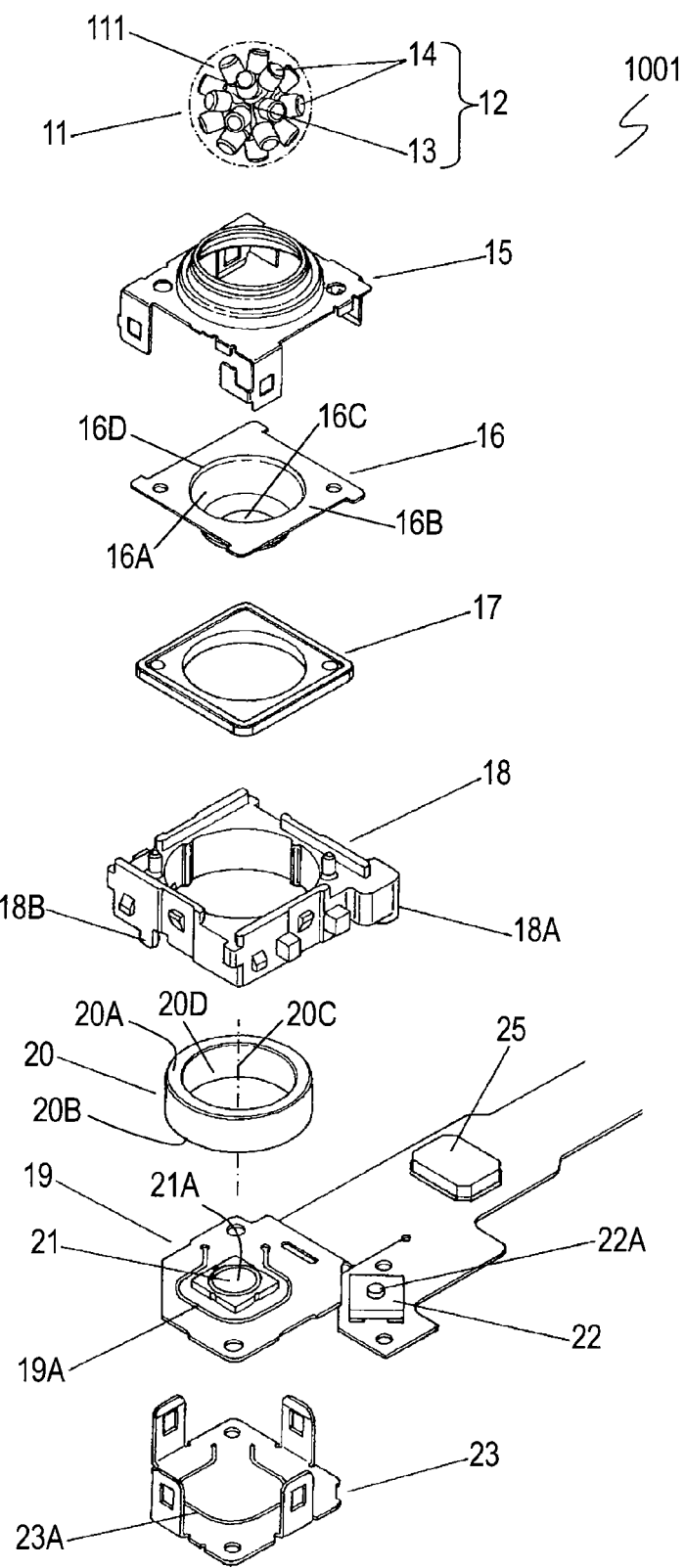
FIG. 2 is an exploded perspective view of the input device according to Embodiment 1.

FIGS. 1 and 2 are a cross sectional view and an exploded perspective view of input device 1001 according to Exemplary Embodiment 1 of the invention, respectively. Actuator 11 having a spherical shape includes magnetic body 12 and cover 111 made of non-magnetic insulating resin, such as ABS resin, polycarbonate, or urethane, covering magnetic body 12. Magnetic body 12 is made of magnetic material, such as permalloy, iron, or Ni—Fe alloy. Magnetic body 12 includes core 13 having substantially a spherical shape and plural protrusions 14 radially extending from core 13. Protrusion 14 has substantially a columnar shape. According to Embodiment 1, twenty four protrusions 14 protrude radially from core 13 with predetermined intervals between the protrusions. Magnetic body 12 is embedded in cover 111.

Upper case 15 and lower case 16 are made of thin metal plates such as steel plates. Lower case 16 includes cup 16A having bottom 16C and flange 16B extending from periphery 16D of cup 16A. Actuator 11 is placed in cup 16A of lower case 16 and is covered with upper case 15. Upper case 15 is attached to lower case 16 to accommodate actuator 11 rotatably about center 511. An upper part of actuator 11 protrudes from opening 15A provided in an upper surface of upper case 15. Protrusions 14 of actuator 11 move along sphere 511A having center 511.

Upper case 15 accommodating actuator 11 and flange 16B of lower case 16 are both placed on an upper surface of rocking part 18 via cover 17. Cover 17 has substantially a plate shape and is made of elastic material, such as rubber or elastomer. Rocking part 18 is made of insulating material, such as polybutylene terephthalate or polystyrene.

Flexible board 19 having elasticity is made of film of, e.g. polyimide, ethylene terephthalate, polycarbonate and is placed below actuator 11. Plural wiring patterns made of carbon or conductive foil of silver or copper are provided on an upper surface and a lower surface of flexible board 19. Magnet 20 made of ferrite or Nd—Fe—B alloy is positioned on the upper surface of flexible board 19. Magnet 20 has a cylindrical shape having hollow 20D therein extending along center axis 20C. Magnet 20 having the cylindrical shape has upper end surface 20A having a ring shape and lower end surface 20B having a ring shape. According to Embodiment 1, upper end surface 20A is an N-pole and lower end surface 20B is an S-pole. Center 511 of actuator 11 is located on center axis 20C. A lower part of actuator 11 is positioned inside hollow part 20D. Center axis 20C is vertical to upper surface 21A.

Magnetic detector 21 detecting magnetic flux is installed on the upper surface of flexible board 19 and in hollow part 20D of magnet 20. Magnetic detector 21 has upper surface 21A (surface lane 21A) facing actuator 11 with a predetermined gap. Slit 19A having substantially a U-shape is formed in flexible board 19 to surround magnetic detector 21. Bottom 16C of cup 16A of lower case 16 contacts upper surface 21A of magnetic detector 21. Flange 16B of lower case 16 is attacked securely onto cover 17. This arrangement separates a lower surface of lower case 16 airtightly and watertightly from an upper surface of the lower case, thus separating an inside of cup 16A from magnetic detector 21 airtightly and watertightly. This structure prevents dust attached onto actuator 11 exposed outside from being attached onto magnetic detector 21.

Push switch 22 including switch contacts is mounted onto the upper surface of flexible board 19 and below actuator 11, and has push button 22A protruding upward. A lower surface of pressing part 18A of rocking part 18 contacts an upper surface of push button 22A.

Frame 23 made of a thin metal plate, such as a steel plate or a copper alloy plate is fixed onto upper case 15, to hold lower case 16 accommodating actuator 11 and rocking part 18 at a predetermined position. Flexible board 19 is placed on an upper surface of frame 23. Slit 23A having substantially a U-shape is formed in frame 23, and surrounds magnetic detector 21. The upper surface of magnetic detector 21 contacts the lower surface of lower case 16.

Wiring patters made of carbon or conductive foil, such as copper foil, are provided on an upper surface and a lower surface of circuit board 24 made of insulating material, such as paper phenol or glass epoxy. A lower part of fulcrum 18B provided at an end of rocking part 18 contacts the upper surface of circuit board 24. Rocking part 18 is rockable on circuit board 24 about fulcrum 18B.

Controller 25 implemented by a semiconductor device, such as a microprocessor, is mounted onto the upper surface of flexible board 19. Controller 25 is connected to magnetic detector 21 and push switch 22 via the wiring patterns.

Figure 3:
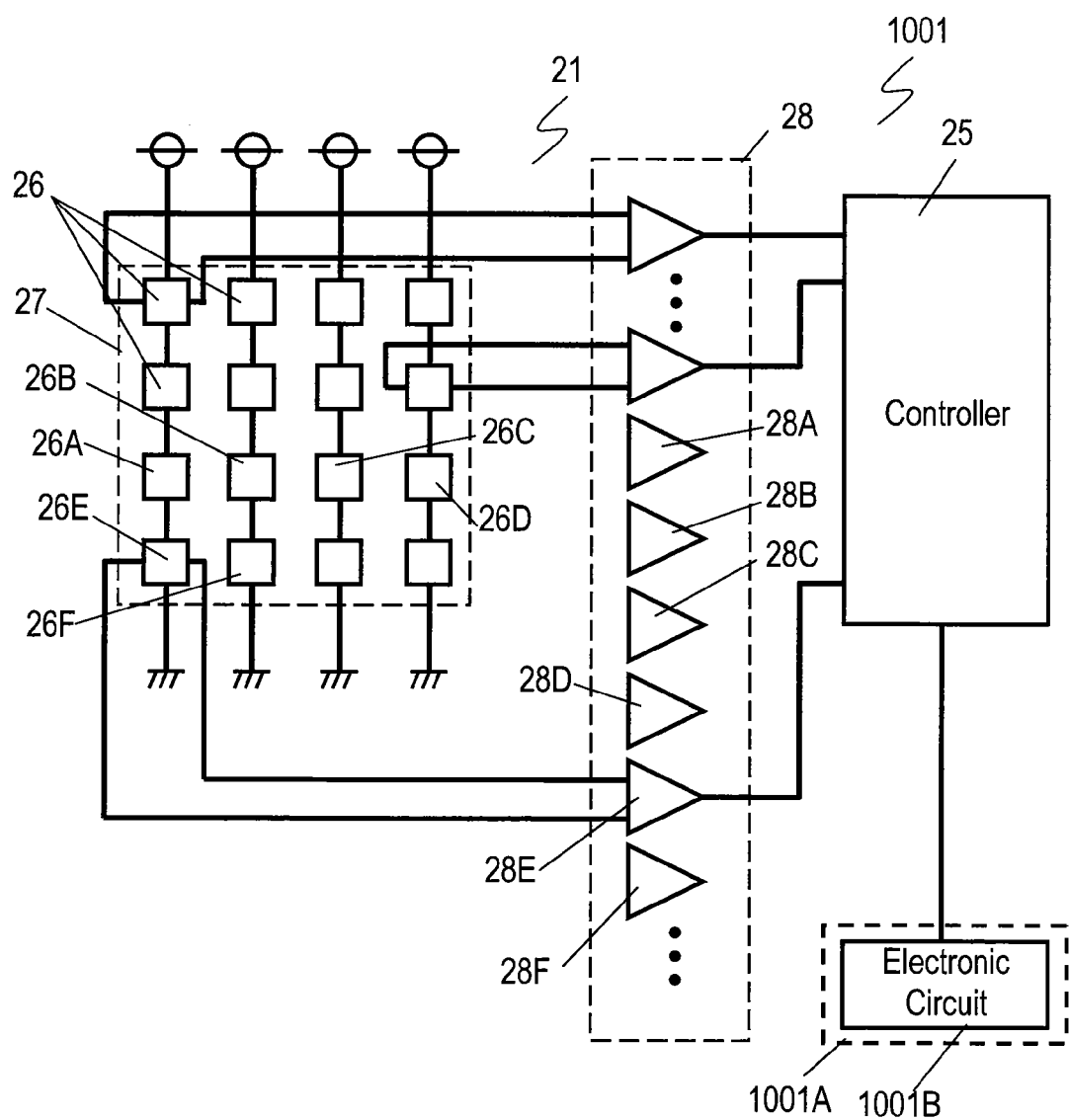
FIG. 3 is a block diagram of a magnetic detector of the input device according to Embodiment 1.

FIG. 3 is a circuit block diagram of magnetic detector 21. Magnetic detector includes nine or more magnetic sensors 26 which detect magnetic fluxes crossing upper surface 21A facing actuator 11. Magnetic sensor 26 is implemented by a Hall element or a giant magneto-resistance (GMR) element. Nine or more magnetic sensors 26 are arranged in a matrix form including three or more rows and three or more columns with equal intervals, thus providing detecting section 27. Magnetic detector 21 according to Embodiment 1 includes sixteen magnetic sensors 26 are arranged in a matrix form having four rows and four columns. Plural magnetic sensors 26 are connected to plural amplifiers 28 including field-effect transistors (FETs). Amplifiers 28 and magnetic sensor 26 are molded in resin package 23C made of insulating resin, such as epoxy. Center axis 20C extends through center 521 of the matrix form in which plural magnetic sensors 26 are arranged.

Figure 4A:
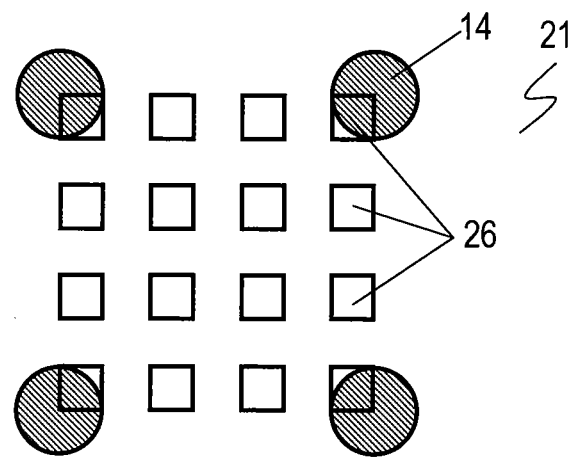
FIGS. 4A and 4B are top plan views of the magnetic detector according to Embodiment 1.
Figure 4B:
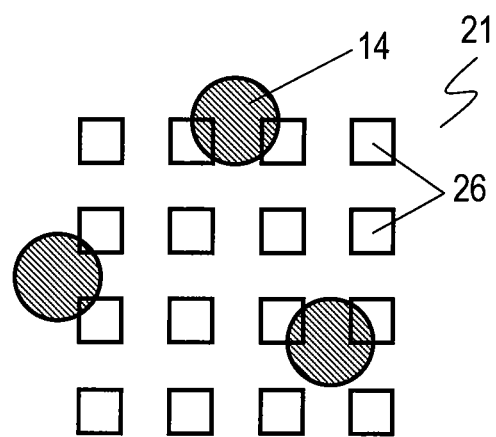

FIGS. 4A and 4B are plan views of magnetic detector 21. In the status shown in FIG. 4A, four magnetic sensors 26 out of the sixteen elements face four protrusions 14, respectively, detecting magnetic flux flowing from protrusion 14. In the status shown in FIG. 4B, some magnetic sensors 26 face three protrusions 14, detecting magnetic flux flowing from protrusions 14. Thus, the intervals among sixteen magnetic sensors 26 and the intervals among twenty four protrusions 14 are determined such that at least one magnetic sensor 26 detect magnetic flux flown from protrusions 14. This arrangement, four or three protrusions 14 protruding downward always face at least one of sixteen magnetic sensors 26 of magnetic detector 21 with a predetermined gap even when an operator rotates actuator 11, forward, backward, leftward or rightward about center 511.

Input device 1001 is installed in an operation panel of electronic device 1001A, such as a mobile phone or a personal computer, with the upper portion of actuator 11 protrudes. Controller 25 is electrically connected to electronic circuit 1001B of electronic device 1001A via a connector or a lead wire.

Figure 5:
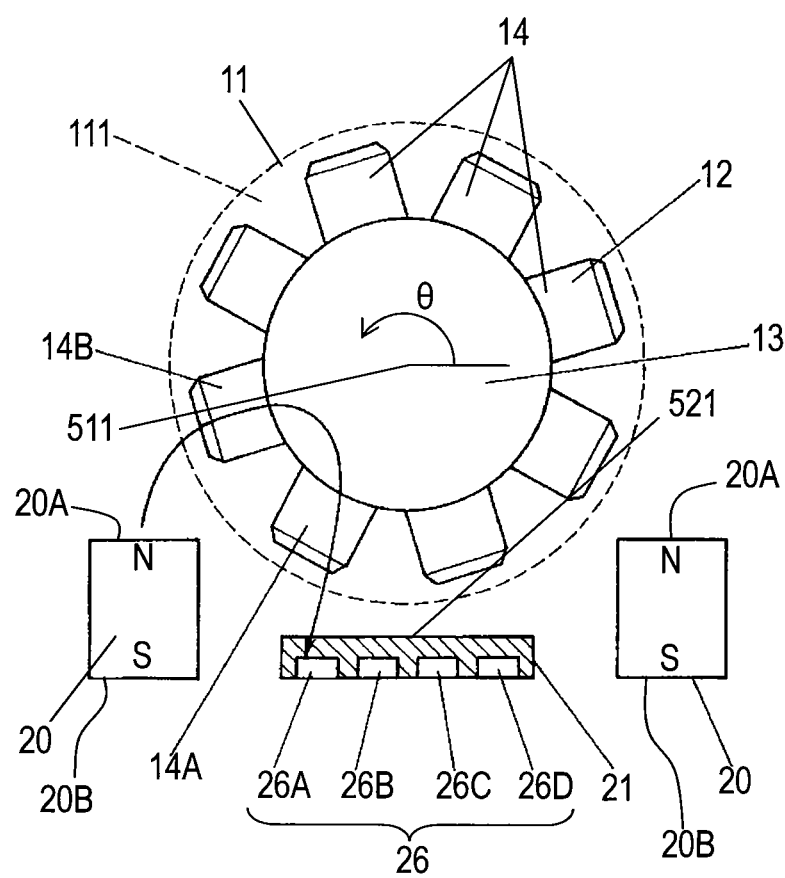
FIG. 5 is a partial cross sectional view of the input device according to Embodiment 1.

An operation of input device 1001 will be explained below. FIG. 5 is a partial perspective view of input device 1001. FIGS. 6A to 6D are partial plan views of magnetic detector 21.

While a cursor or a menu, such as names or titles of music is displayed on a liquid crystal display of an electronic device, upon an operator rotating an upper part of actuator 11 with a finger, forward, backward, leftward or rightward, magnetic body 12 embedded in actuator 11 rotates accordingly.

An operation input device 1001 with actuator 11 rotating so that protrusion 14A of actuator 11 passes directly above magnetic sensors 26A to 26D out of magnetic sensors 26 arranged along a row will be described below.

Figure 6A:
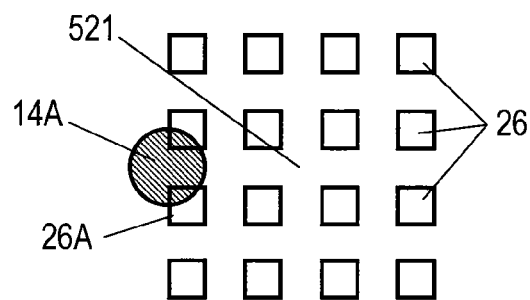
FIGS. 6A to 6D are top plan views of the magnetic detector according to Embodiment 1.

As shown in FIGS. 5 and 6A, when the operator rotates actuator 11 in a left direction, protrusion 14A out of protrusions 14 of magnetic body 12 moves to approach magnetic sensor 26A located a left end out of magnetic sensors 26 of magnetic detector 21. Magnetic flux emitted from upper end surface 20A of magnet 20 flows through protrusion 14B out of protrusions 14 which is the closest to magnet 20, core 13, and protrusion 14A, and is detected by the left end magnetic sensor 26A.

Figure 7:
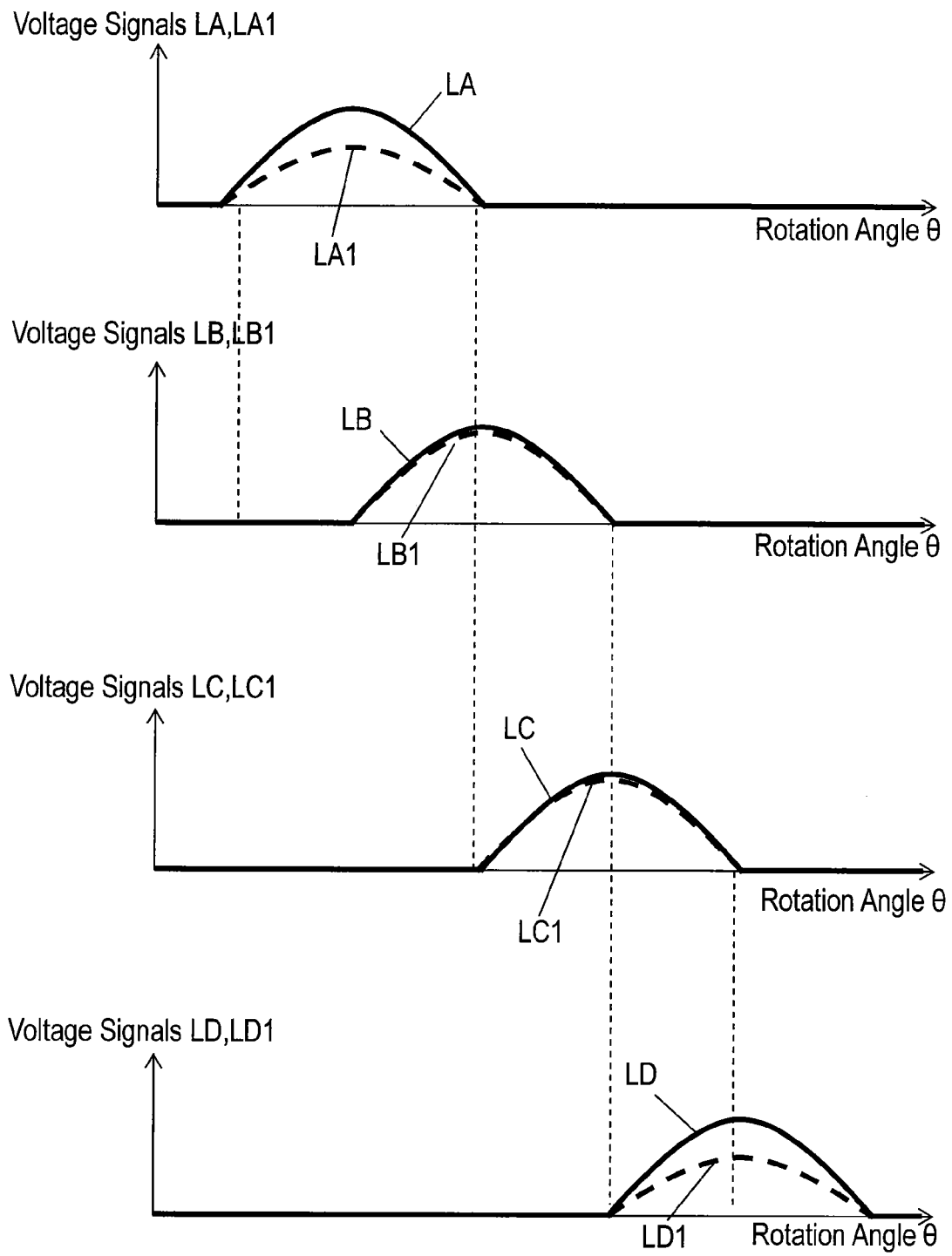
FIG. 7 illustrates wave forms of signals of the input device according to Embodiment 1.

FIG. 7 shows waveforms of signals output from amplifiers 28. When the operator continues rotating actuator 11 further in the left direction to position protrusion 14A substantially directly above magnetic sensor 26A, the magnetic flux detected by magnetic sensor 26A becomes the strongest. After that, as protrusion 14A leaves in a right direction, the amount of detected magnetic flux decreases. Magnetic sensor 26A accordingly outputs voltage signal LA1 shown in FIG. 7. Amplifier 28A out of amplifiers 28 connected to magnetic sensor 26A amplifies signal LA1, and outputs voltage signal LA.

Figure 6B:
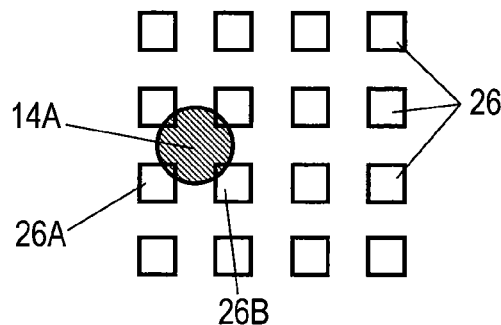

As the operator continues turning actuator 11 further in the left direction, protrusion 14A approaches magnetic sensor 26B adjacent to magnetic sensor 26A. As shown in FIG. 6B, when protrusion 14A is located at the middle between magnetic sensor 26A and 26B, magnetic flux flown from protrusion 14A is detected by both magnetic sensors 26A and 26B.

Figure 6C:
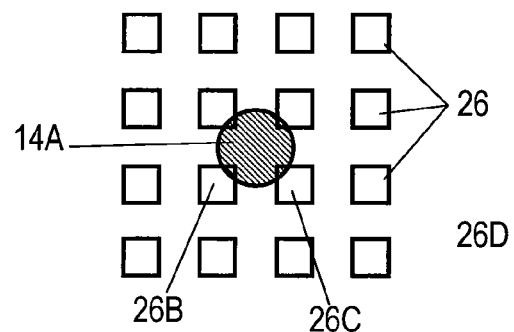

After that, as the operator continues turning actuator 11 further in the left direction, the magnetic flux flown from protrusion 14A is detected by magnetic sensors 26B and 26C, and then, is detected by magnetic sensors 26C and 26D, as shown in FIG. 6C. In other words, magnetic flux flown from protrusion 14A is detected by two magnetic sensors out of magnetic sensors 26 adjacent to each other. Thus, magnetic sensor 26B outputs voltage signal LB1 shown in FIG. 7. Amplifier 28B out of amplifiers 28 connected to magnetic sensor 26B amplifies voltage signal LB1 and outputs voltage signal LB. Similarly, magnetic sensor 26C outputs voltage signal LC1 shown in FIG. 7, and amplifier 28C out of amplifiers 28 connected to magnetic sensor 26C amplifies voltage signal LC1 and outputs voltage signal LC. Similarly, magnetic sensor 26D outputs voltage signal LD1 shown in FIG. 7. Amplifier 28D out of amplifiers 28 connected to magnetic sensor 26D amplifies voltage signal LD1 and output voltage signal LD.

Figure 8:
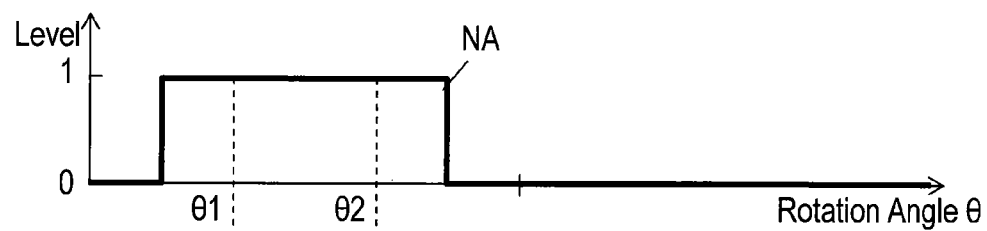
FIG. 8 illustrates wave forms of signals of the input device according to Embodiment 1.
Figure 8:
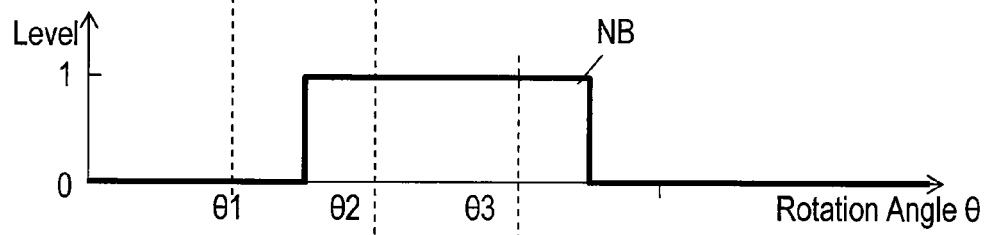
Figure 8:
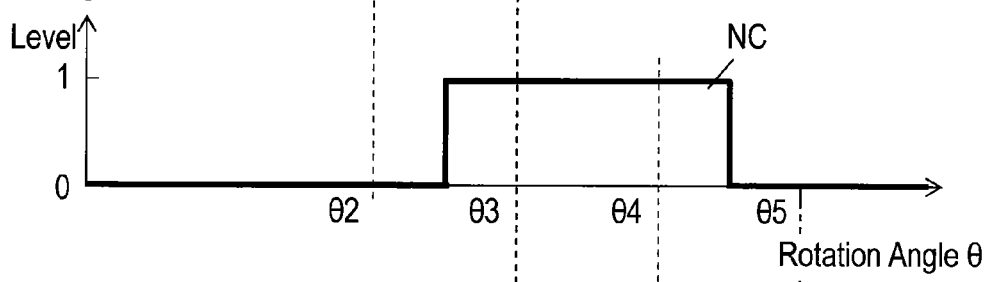
Figure 8:
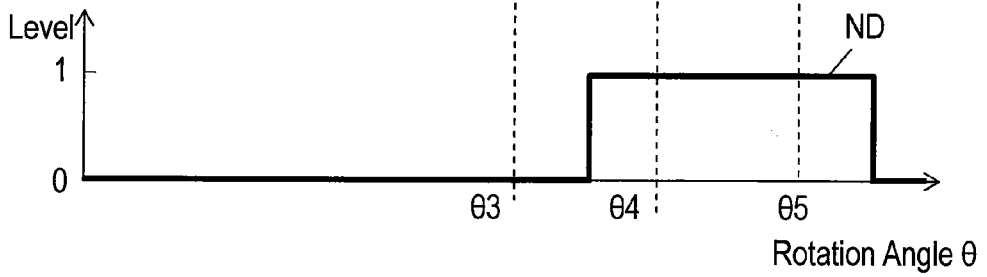

FIG. 8 shows waveforms of signals output from controller 25. While the operator rotates actuator 11 to change rotation angle θ of protrusion 14A from angle θ1 to angle θ5, in response to voltage signals LA to LD output from magnetic sensors 26A to 26D arranged at an equal intervals in the row, controller 25 outputs, to electronic circuit 1001B of electronic device 1001A, pulse signals NA to ND having levels of "1" and "0" and phases different from each other shown in FIG. 8. Electronic circuit 1001B detects rotation angle θ of protrusion 14A based on the signals output from two magnetic sensors out of magnetic sensors 26 adjacent to each other.

In other words, while rotation angle θ of protrusion 14A is between angles θ1 and θ3, rotation angle θ is detected based on pulse signals NA and NB obtained from signals LA1 and LB1 output from magnetic sensors 26A and 26B, respectively. When pulse signal NA has a level of "1" and pulse signal NB has a level of "0", electronic circuit 1001B detects rotation angle θ of protrusion 14A to be angle θ1. When pulse signals NA and NB have a level of "1", electronic circuit 1001B detects rotation angle θ to be angle θ2. When pulse signal NA has a level of "0" and pulse signal NB has a level of "1", electronic circuit 1001B detects rotation angle θ to be angle θ3.

Similarly, while rotation angle θ of protrusion 14A is between angles θ2 and θ4, circuit 1001B detects rotation angle θ based on pulse signals NB and NC obtained from signals LB1 and LB 2 output from magnetic sensors 26B and 26C. When pulse signal NB has a level of "1" and pulse signal NC has a level of "0", electronic circuit 1001B detects rotation angle θ of protrusion 14A to be angle θ2. When pulse signal NB and NC have a level of "1", electronic circuit 1001B detects rotation angle θ to be angle θ3. When pulse signal NB has a level of "0" and pulse signal NC has a level of "1", electronic circuit 1001B detects rotation angle θ to be angle θ4.

Similarly, while rotation angle θ of protrusion 14A is between angles θ3 and θ5, the circuit detects rotation angle θ based on pulse signals NC and ND obtained from signals LC1 and LD1 output from magnetic sensors 26C and 26D. When pulse signal NC has a level of "1" and pulse signal ND has a level of "0", electronic circuit 1001B detects rotation angle θ of protrusion 14A to be angle θ3. When pulse signals NC and ND have a level of "1", electronic circuit 1001B detects rotation angle θ to be angle θ4. When pulse signal NC has a level of "0" and pulse signal ND has a level of "1", electronic circuit 1001B detects rotation angle θ to be angle θ5.

Further, as pulse signal NA of magnetic sensor 26A changes from the level of "0" to the level of "1", then pulse signal NB of magnetic sensor 26B changes from the level of "0" to the level of "1", then pulse signal value NC of magnetic sensor 26C changes from the level of "0" to the level of "1", and then pulse signal ND changes from the level of "0" to the level of "1", electronic circuit 1001B detects that protrusion 14A rotates in the left direction and protrusion 14A moves from directly above magnetic sensor 26A to directly above magnetic sensor 26D.

As described above, electronic circuit 1001B detects the rotation direction of actuator 11A based on the rising edges of pulse signals having phases different from each other obtained from the signals output from two magnetic sensors adjacent to each other. The circuit also detects rotation angle θ of actuator 11 based on the combination of levels of "0" and "1" of the pulse signals. Based on the detected rotation direction and rotation angle θ of actuator 11, the cursor on the menu indicated on the display of electronic device 1001A moves to the detected rotation direction, leftward, for instance, by the amount corresponding to the detected rotation angle θ.

Figure 6D:
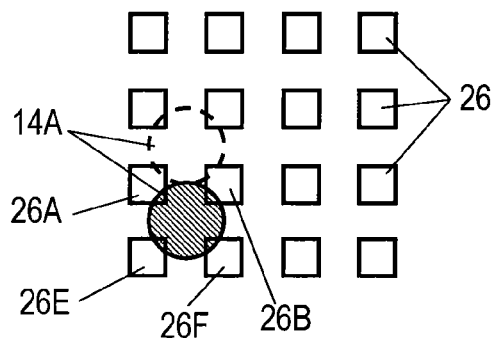

The operator may rotate actuator 11 in a right direction, a forward direction, a backward direction, or a diagonal direction between these directions. When the operator rotates actuator 11 in the forward direction, protrusion 14A moves from a position between magnetic sensors 26A and 26B to a position between magnetic sensors 26E and 26F which are adjacent to 26A and 26B, respectively, along a column of the matrix form, as shown in FIG. 6D. Voltage signals output from magnetic sensors 26A, 26B, 26E, and 26F are amplified by amplifiers 28A, 28B, 28E, and 28F out of amplifiers 28 connected to magnetic sensors 26A, 26B, 26E, and 26F. Controller 25 outputs pulse signals based on the voltage signals output from magnetic sensors 26A, 26B, 26E, and 26F. Based on the pulse signals, electronic circuit 1001B detects a rotation direction and a rotation angle of actuator 11 accurately without an error, and moves the cursor in a rightward direction, an upward direction, a downward direction, or a diagonal direction.

If the operator presses an upper part of actuator 11 while the cursor positioned on a desired menu, rocking part 18 rocks about fulcrum part 18B contacting the upper surface of circuit board 24. A lower surface of pressing part 18A which is an end of rocking part 18 pushes down push button 22A, activating push switch 22. Controller 25 detects the movement of push switch 22 and outputs a signal to electronic circuit 1001B. The circuit, for example, determines a menu or displays the next menu.

Figure 14:
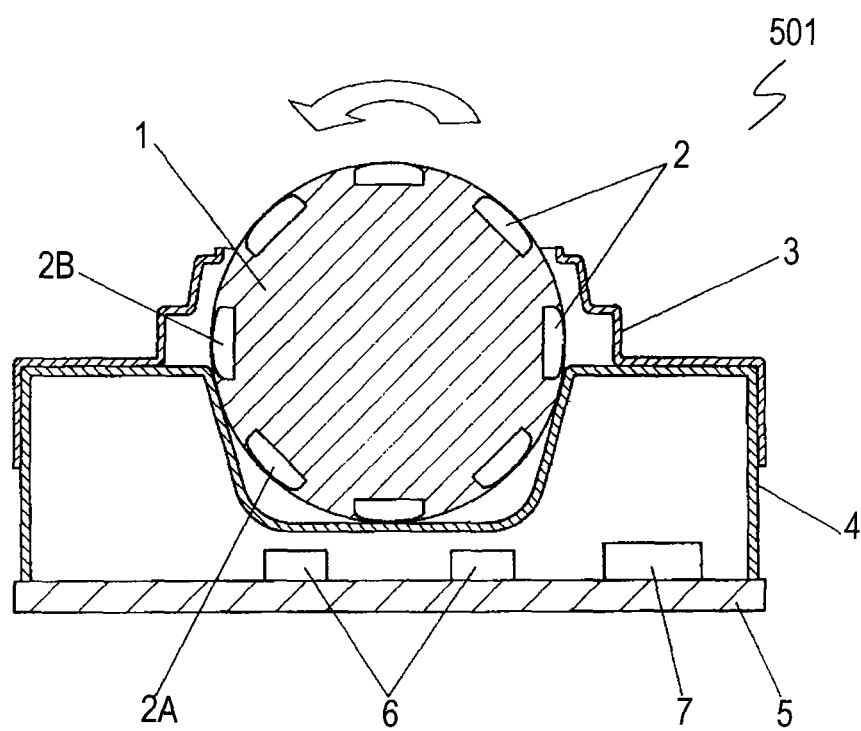
FIG. 14 is a cross sectional view of a conventional input device.

Conventional input device 501 shown in FIG. 14 includes four magnetic sensors 6 detecting a rotation direction and a rotation angle of actuator 1 in a forward direction, a backward direction, a rightward direction, or a leftward direction, hence the rotation angle and direction only roughly. In input device 1001 according to Embodiment 1, however, magnetic sensors 26 are arranged in a matrix form having three or more rows and three or more columns. Electronic circuit 1001B detects a rotation direction and a rotation angle of actuator 11 accurately with a small error based on the pulse signals output from two pairs of magnetic sensors out of the magnetic sensors 26 adjacent to each other, for example, based on pulse signals having phases different from each other output from a pair of magnetic sensors 26A and 26B and on pulse signals having phases different from each other output from a pair of magnetic sensors 26C and 26D.

Since actuator 11 has a spherical shape, a gap between actuator 11 and each of magnetic sensors 26A and 26D located at a periphery of the matrix form is larger than a gap between actuator 11 and each of magnetic sensors 26B and 26C located at a center of the matrix form, as shown in FIG. 5. The intensity of magnetic flux flown from protrusions 14 and detected by magnetic detector 26 is measured differently. Namely, voltage signals LA1 and LD1 output from magnetic sensors 26A and 26D are smaller than voltage signals LB1 and LC1 output from magnetic sensors 26B and 26C. The gains of amplifiers 28A and 28D which amplifies voltage signals LA1 and LD1 output from magnetic sensors 26A and 26D are determined to be larger than the gains of amplifiers 28B and 28C which amplifies voltage signals LB1 and LC1 output from magnetic sensors 26B and 26C so as to allow voltage signals LA to LD output from amplifier 28A to 28D to be substantially equal to each other. Pulse signals NA to ND output from controller 25 match with voltage signals LA1 to LD1 accurately, respectively. Electronic circuit 1001B detects rotation angle θ of actuator 11, accurately.

Figure 9:
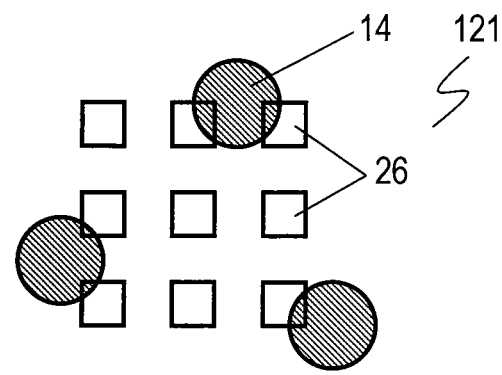
FIG. 9 is a top view of another magnetic detector according to Embodiment 1.

FIG. 9 is a top view of another magnetic detector 121 according to Embodiment 1. In FIG. 9, components identical to those of magnetic detector 21 shown in FIGS. 4A and 4B are denoted by the same reference numerals. In magnetic detector 21 shown in FIGS. 4A and 4B, sixteen magnetic sensors 26 are arranged at equal intervals in the matrix form having four rows and four columns. In magnetic detector 121 shown in FIG. 9, nine magnetic sensors 26 are arranged in a matrix form having three rows and three columns. Similarly to magnetic detector 21 shown in FIGS. 4A and 4B, magnetic detector 121 detects a moving direction and a moving amount of protrusions 14 based on voltage signals output from magnetic sensors out of nine magnetic sensors 26 adjacent to each other, thereby detecting a rotation direction and a rotation angle of actuator 11 accurately with a small error.

Figure 10:
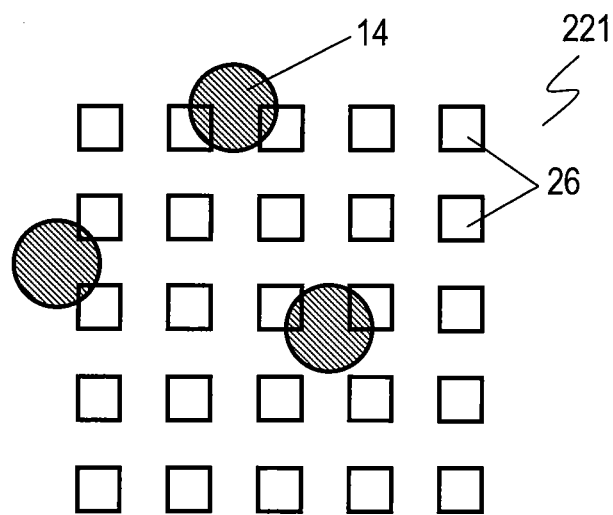
FIG. 10 is a top view of still another magnetic detector according to exemplary embodiment 1.

FIG. 10 is a top view of still another magnetic detector 221 according to Embodiment 1. In FIG. 10, components identical to those of magnetic detector 21 shown in FIGS. 4A and 4B are denoted by the same reference numerals. In magnetic detector 221 shown in FIG. 10, twenty-five magnetic sensors 26 are arranged with equal intervals in a matrix form having five rows and five columns. Similarly to magnetic detector 21 shown in FIGS. 4A and 4B, magnetic detector 221 detects a moving direction and a moving amount of protrusions 14 based on voltage signals output from magnetic sensors out of twenty-five magnetic sensors 26 adjacent to each other, thereby detecting a rotation direction and a rotation angle of actuator 11 accurately with a small error. The magnetic sensors 26 may be arranged with equal intervals in a matrix form having six or more rows and six or more columns, providing the same effects.

Controller 25 always supplies power to magnetic sensors 26B and 26C arranged inner than magnetic sensors 26A, 26D, 26E and 26F located at an outer periphery of the matrix form shown in FIG. 6D, and does not always supply power magnetic sensors 26A, 26D, 26E and 26F located at the outer periphery of the matrix form. Controller 25 supplies power to magnetic sensors 26A, 26D, 26E and 26F located at the outer periphery of the matrix form to detect a rotation angle of actuator 11 only when an operator rotates actuator 11 to cause magnetic sensor 26B and 26C to detect a magnetic flux flown from protrusion 14. When magnetic sensors 26B and 26C does not detect the magnetic flux, controller 25 does not supply power to any of magnetic sensors 26A, 26D, 26E, and 26F. Alternatively, controller 25 supplies power to magnetic sensors 26A, 26D, 26E and 26F at the outer periphery of the matrix form for detecting the rotation angle of actuator 11 only when the operator rotates actuator 11 to cause magnetic sensors 26B and 26C detect the change of the magnetic flux output from protrusion 14. When sensors 26B and 26C does not detect the change of magnetic flux, controller 25 does not supply power to any of magnetic sensors 26A, 26D, 26E, and 26F. This operation reduces electrical power consumption, such as battery consumption, thus achieving power saving of input device 1001 and electronic device 1001A.

Exemplary Embodiment 2

Figure 11A:
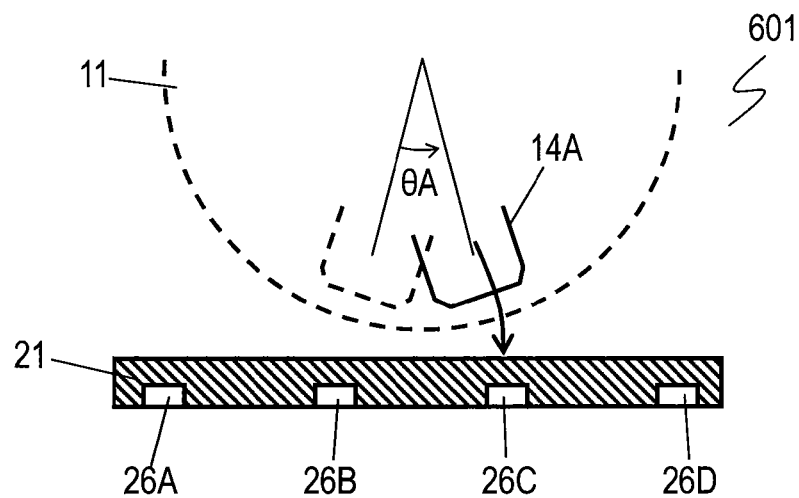
FIGS. 11A and 11B are partial cross sectional views of a comparative example of an input device.
Figure 11B:
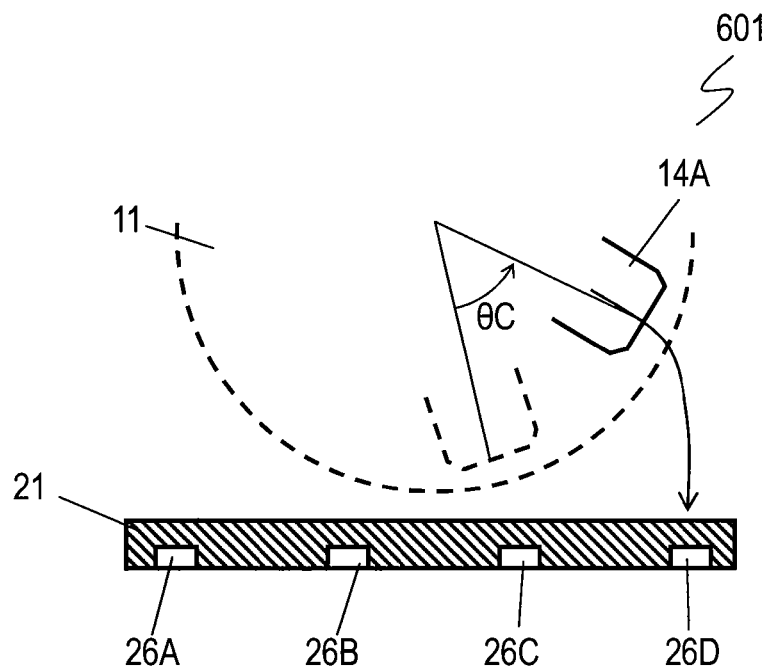
Figure 12:
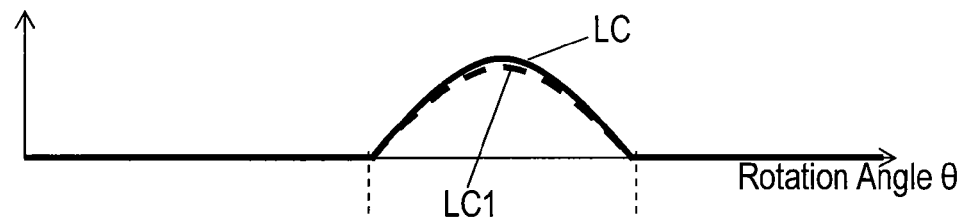
FIG. 12 illustrates a wave form of a signal of the input device according to exemplary embodiment 1 (the comparative example).
Figure 12:
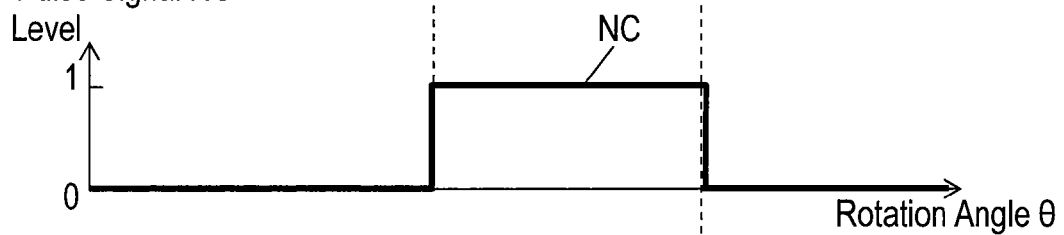
Figure 12:
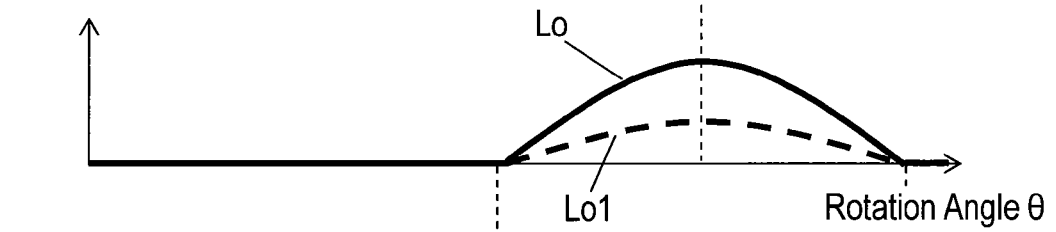
Figure 12:
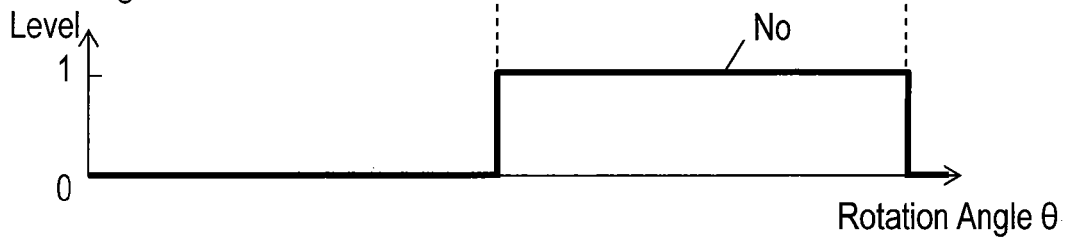

FIGS. 11A and 11B are a partial cross-sectional view of input device 601, a comparative example. FIG. 12 shows waveforms of signals of input device 601. In magnetic detector 21 of input device 601, sixteen magnetic sensors 26 are arranged at equal intervals in a matrix form having four rows and four columns. Magnetic sensor 26C is located at an inner part of the matrix form, substantially directly under actuator 11, hence having a narrow gap between magnetic sensor 26C and actuator 11. In the case that the width of magnetic detector 21 is substantially equal to the width of actuator 11, a gap between actuator 11 and magnetic sensor 26D located at an end of the matrix form is wider than a gap between actuator 11 and magnetic sensor 26C. As an operator rotates actuator 11 in a leftward direction, the magnetic flux is detected by magnetic sensor 26D from the position where magnetic sensor 26C at the inner part detects magnetic flux from protrusion 14A to the position where protrusion 14 rotates by an angle shown in FIG. 11B. Rotation angle θC by which the protrusion rotates from the position where magnetic sensor 26C detects the magnetic flux to the position where magnetic sensor 26D detects the flux is larger than angle θA by which the protrusion rotates from the position where magnetic sensor 26B detects the magnetic flux to the position where magnetic sensor 26C detects the flux. This arrangement causes magnetic sensor 26C to output voltage signal LC1 shown in FIG. 12. Amplifier 28C amplifies voltage signal LC1 to output voltage signal LC. Magnetic sensor 26D outputs voltage signal Lo1 shown in FIG. 12 and amplifier 28D amplifies voltage signal Lo1 to output voltage signal Lo. Voltage signals LC and Lo causes controller 25 to output pulse signals NC and No shown in FIG. 12. Since angle θC is larger than angle θA, voltage signal Lo is wider than voltage signal LC, therefore pulse signal No becomes wider than pulse signal NC. Thus, in input device 601 shown in FIGS. 11A and 11B, even when actuator 11 rotates at a constant angular speed, controller 25 outputs pulse signals NC and No having different widths.

Figure 13A:
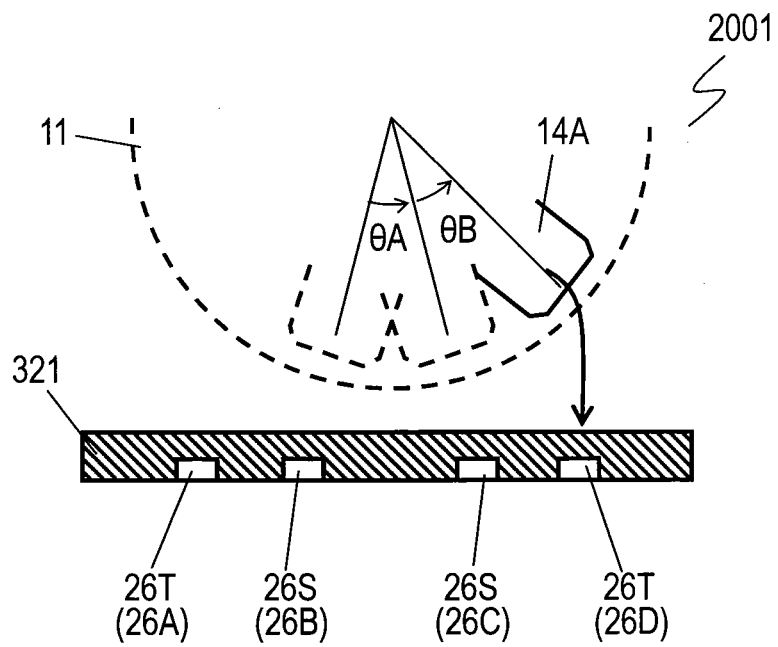
FIG. 13A is a partial cross sectional view of an input device according to Exemplary Embodiment 2 of the invention.
Figure 13B:
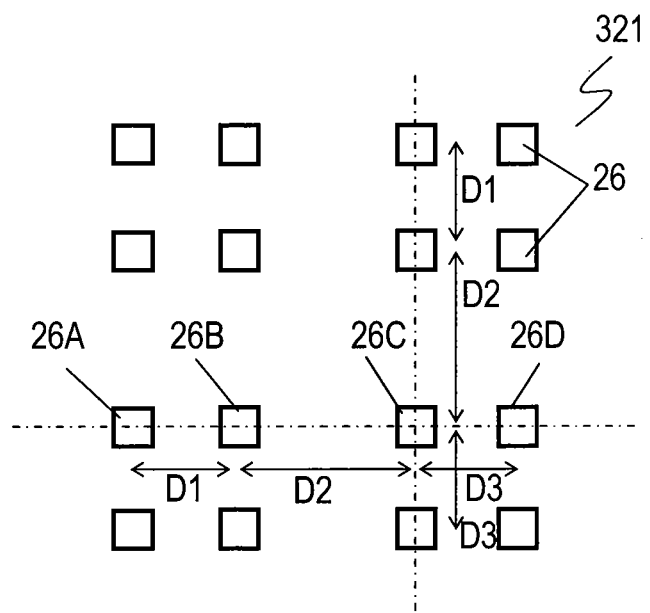
FIG. 13B is a top plan view of a magnet detector of the input device according to Embodiment 2.

FIG. 13A is a partial cross-sectional view of input device 2001 according to Exemplary Embodiment 2 of the invention. Input device 2001 according to Embodiment 2 includes magnetic detector 321 instead of magnetic detector 21 of input device 1001 according to Embodiment 1 shown in FIGS. 1 and 5. FIG. 13B is a top view of magnetic detector 321. In FIGS. 13A and 13B, components identical to those of input device 1001 according to Embodiment 1 shown in FIGS. 1 and 5 are denoted by the same reference numerals. Magnetic detector 321 according to Embodiment 2 is different from the comparative example of magnetic detector 21 of input device 601 in intervals between magnetic sensors 26.

As shown in FIG. 13B, in input device 2001 according to Embodiment 2, magnetic sensors 26 of magnetic detector 321 is arranged in a matrix form having four or more rows and four or more columns. Magnetic sensors 26 include magnetic sensors 26T located at an outer periphery of the matrix form and magnetic sensors 26S located at a portion of the matrix form inner than magnetic sensors 26T. In FIG. 13B, magnetic sensors 26A to 26D are arranged in a row. Magnetic sensors 26A and 26D are located at the outer periphery of the matrix form and are a part of magnetic sensors 26T. Magnetic sensors 26B and 26C are located at the inner portion of the matrix form and are a part of magnetic sensors 26S. Interval D2 between magnetic sensors 26B and 26C adjacent to each other is larger than interval D1 between magnetic sensors 26A and 26B and interval D3 between magnetic sensors 26C and 26D. Namely, in each of the rows and the columns of the matrix form, interval D2 between magnetic sensors 26B and 26C out of magnetic sensors 26S adjacent to each other is larger than interval D1 (D3) between magnetic sensor 26A (26D) out of magnetic sensors 26T and magnetic sensor 26B (26C) out of magnetic sensors 26S adjacent to magnetic sensor 26A (26D).

With this arrangement, rotation angle θA by which protrusion 14A rotates from the position where magnetic sensor 26B detects the magnetic flux from protrusion 14 to the position where magnetic sensor 26C detects the magnetic flux is substantially equal to rotation angle θC (θB) by which protrusion 14 rotates from the position where magnetic sensor 26C detects the magnetic flux to the position where magnetic sensor 26D detects the magnetic flux.

Figure 13C:
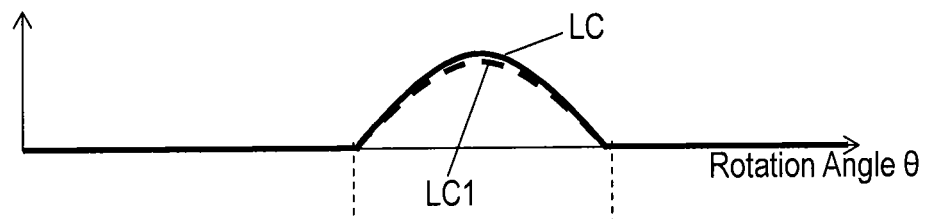
FIG. 13C illustrates a wave form of a signal of the input device according to Embodiment 2.
Figure 13C:
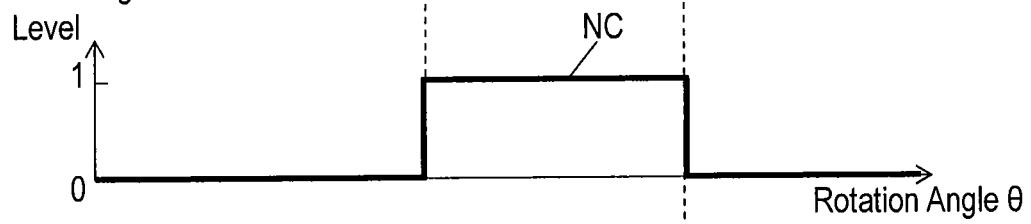
Figure 13C:
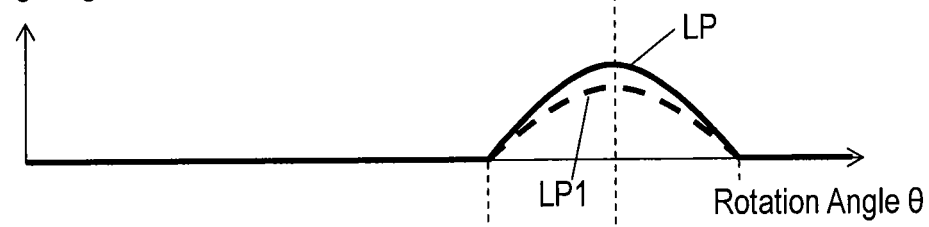
Figure 13C:
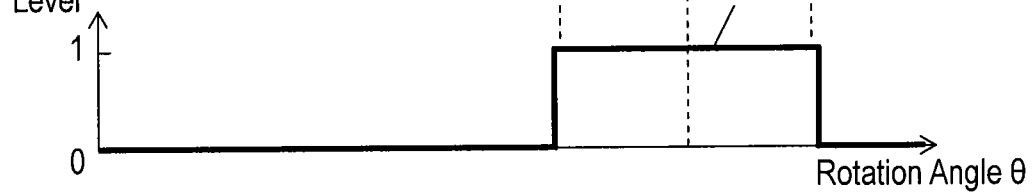

FIG. 13C illustrates wave forms of signals of input device 2001 according to Embodiment 2. The above arrangement allows magnetic sensors 26C and 26D of magnetic detector 321 shown in FIGS. 13A and 13B outputs voltage signals LC1 and LP1 shown in FIG. 13C. Amplifiers 28C and 28D connected to magnetic sensors 26C and 26D amplifies voltage signals LC1 and LP1 to output voltage signals LC and LP, respectively. Controller 25 then outputs pulse signals NC and NP shown in FIG. 13C based on voltage signals LC and LP, respectively. Since angle θB is substantially equal to angle θA, the width of voltage signal LP is substantially equal to the width of voltage signal LC, accordingly allows the width of pulse signal NP to be substantially equal to the width of pulse signal NC. Consequently, in input device 2001 according to Embodiment 2, when actuator 11 rotates at a constant angular speed, controller 25 outputs pulse signals NC and NP having widths substantially equal to each other.

As demonstrated, magnetic sensors 26 are arranged in a matrix form at different intervals according to the sizes of actuator 11 and magnetic detector 21, and output pulse signals which have widths equal to each other and phases different from each other according to the rotation speed of actuator 11. Input device 2001 thus detects the rotation angle of actuator 11 accurately without an error. This arrangement is applicable to a magnetic detector, such as magnetic detectors 121 and 221 shown in FIGS. 9 and 10, including plural magnetic sensors arranged in a matrix form having three or more rows and three or more columns, providing the same effects.

Actuator 11 includes magnetic body 12 locally emitting magnetic flux from a surface of the body. In input devices 1001 and 1002 according to Embodiments 1 and 2, actuator 11 includes magnetic body 12 and cover 111 having magnetic body 12 embedded therein. Magnetic body 12 includes protrusions 14 radially protruding from core 13 at predetermined intervals. Input devices 1001 and 2001 further includes magnet 20 having cylindrical shape surrounding actuator 11. Actuator 11 is not magnetized, and receives magnetic flux flown emitted from magnet 20 with at least one protrusion out of protrusions 14 of magnetic body 12 and emits the received magnetic flux from another protrusion (14A). Alternatively, input devices 1001 and 1002 according to Embodiments 1 and 2 does not necessarily include magnet 20 and magnetic body 12 can be a magnet. In this case, magnetic body 12 generates magnetic flux and emits the flux from protrusions 14. Alternatively, actuator 11 may have a structure identical to that of actuator 1 of conventional input device 501 shown in FIG. 14 including magnets 2 embedded in a surface thereof.

Detecting section 27 which includes magnetic sensors 26 arranged in front, back, left and right in the matrix form and amplifiers 28 connected to detecting section 27 constitute magnetic detector 21. Controller 25 connected to magnetic detector 21 detects a rotation angle of actuator 11. Controller 25, detecting section 27 and amplifiers 28 may be molded unitarily with magnetic detector 21 in resin package 23C. This structure allows input devices 1001 and 2001 to be produced simply and inexpensively.

In input devices 1001 and 2001 according to Embodiment 1 and 2, actuator 11 has the spherical shape having a circular cross section. The rotation angle and the rotation direction of the actuator are detected by magnetic detector 21. Actuator 11 may have a column shape having a circular cross section in which magnetic detector 21 detects the rotation angle and the rotation direction of the actuator. Alternatively, actuator 11 may have a rectangular shape which does not rotate other than the spherical shape or the column shape, in which magnetic detector 21 detects a moving direction and a moving amount of actuator 11.

According to Embodiments 1 and 2, terms, such as "upper surface", "lower surface", "under", "directly above", "upper end surface", and "lower end surface", indicating direction just indicate a relative direction depending on a relative positional relationship between components, such as actuator 11 and magnetic detector 21 of input device 1001, and does not indicate an absolute direction, such as a vertical direction.

What is claimed is:

1. An input device comprising:
    an actuator including a magnetic body which moves and emits magnetic flux, the magnetic body movable rotatably about a rotation center; and
    a magnetic detector having an upper surface facing the actuator,
    wherein the magnetic detector includes a plurality of magnetic sensors for detecting the magnetic flux, the plurality of magnetic sensors being arranged in a matrix form having three or more rows and three or more columns along the upper surface of the magnetic detector,
    wherein the plurality of magnetic sensors includes:
        a plurality of first magnetic sensors located in a first region at an outer periphery of the matrix form, and
        a plurality of second magnetic sensors located in a second region of the matrix form interior of the first magnetic sensors, the second region of the matrix form being surrounded by the first region of the matrix form,
    wherein, in each of the three or more rows and the three or more columns, an interval between magnetic sensors out of the plurality of second magnetic sensors adjacent to each other is larger than an interval between a magnetic sensor out of the plurality of first magnetic sensors and a magnetic sensor of the plurality of second magnetic sensors adjacent to the magnetic sensor out of the plurality of first magnetic sensors, and wherein the rotation center of the actuator is located over the second region of the matrix form.

2. The input device according to claim 1, further including a magnet emitting a magnetic flux to the actuator.

3. The input device according to claim 2, wherein the actuator includes
a magnetic body including a core and a plurality of protrusions radially protruding from the core, and
a package covering the magnetic body.

4. The input device according to claim 1, wherein
the actuator has a spherical shape,
the rotation center of the actuator is positioned in a center axis the center axis being perpendicular to the upper surface of the magnetic detector and passing through a center of the matrix form in which the plurality of magnetic sensors are arranged.

5. The input device according to claim 4, wherein the actuator includes
a magnetic body including a core and a plurality of protrusions radially protruding from the core, and
a package covering the magnetic body.

6. The input device according to claim 1, further comprising
a plurality of amplifiers connected to the detecting section.

7. The input device according to claim 6,
wherein the plurality of amplifiers includes:
a plurality of first amplifiers for amplifying an output of the plurality of first magnetic sensors; and
a plurality of second amplifiers for amplifying an output of the plurality of second magnetic sensors, and
wherein gains of the plurality of first amplifiers are larger than gains of the plurality of second amplifiers.

8. The input device according to claim 1,
wherein, when the magnetic body is located at a first angular position about the rotation center in each one of the three or more rows and the three or more columns, one of the plurality of second magnetic sensors detects the magnetic flux,
wherein, when the magnetic body is located at a second angular position about the rotation center in said each one of the three or more rows and the three or more columns, another one of the plurality of second magnetic sensors detects the magnetic flux,
wherein, when the magnetic body is located at a third angular position about the rotation center in said each one of the three or more rows and the three or more columns, one of the plurality of first magnetic sensors detects the magnetic flux,
wherein the first angular position and the second angular position defines a first angle about the rotation center,
wherein the second angular position and the third angular position defines a second angle about the rotation center, and
wherein the plurality of magnetic sensors are arranged such that the first angle is equal to the second angle.

9. The input device according to claim 8,
wherein, when the magnetic body is located at the first angular position about the rotation center, the magnetic body is located over the one of the plurality of second magnetic sensors, wherein, when the magnetic body is located at the second angular position about the rotation center, the magnetic body is located over the another one of the plurality of second magnetic sensors,
wherein, when the magnetic body is located at the third angular position about the rotation center, the magnetic body is located over the one of the plurality of first magnetic sensors.

10. The input device according to claim 1,
wherein, when the magnetic body is located at a first angular position about the rotation center in each one of the three or more rows and the three or more columns, the magnetic body is located over one of the plurality of second magnetic sensors,
wherein, when the magnetic body is located at a second angular position about the rotation center in said each one of the three or more rows and the three or more columns, the magnetic body is located over another one of the plurality of second magnetic sensors,
wherein, when the magnetic body is located at a third angular position about the rotation center in said each one of the three or more rows and the three or more columns, the magnetic body is located over one of the plurality of first magnetic sensors detects,
wherein the first angular position and the second angular position defines a first angle about the rotation center,
wherein the second angular position and the third angular position defines a second angle about the rotation center, and
wherein the plurality of magnetic sensors are arranged such that the first angle is equal to the second angle.

11. The input device according to claim 1, further comprising
a controller operable to supply power to the plurality of first magnetic sensors to allow the plurality of first magnetic sensors to detect the magnetic flux,
wherein the controller is operable:
to supply the power to the plurality of first magnetic sensors when at least one of the plurality of second magnetic sensors detects the magnetic flux; and
not to supply the power to the plurality of first magnetic sensors when the plurality of second magnetic sensors do not detect the magnetic flux.

12. The input device according to claim 1, further comprising
a controller operable to supply power to the plurality of first magnetic sensors to allow the plurality of first magnetic sensors to detect the magnetic flux,
wherein the controller is operable:
to supply the power to the plurality of first magnetic sensors when at least one of the plurality of second magnetic sensors detects a change of the magnetic flux; and
not to supply the power to the plurality of first magnetic sensors when any of the plurality of second magnetic sensors does not detect a change of the magnetic flux.

13. The input device according to claim 1, the three or more rows and the three or more columns of the matrix form comprises four or more rows and four or more columns.

* * * * *